310-322 SR

3/4/80 OR 4,191,904

United States Patent [19]

Massa

[11] 4,191,904

[45] Mar. 4, 1980

[54] ELECTROACOUSTIC TRANSDUCERS OF THE FLEXURAL RESONANT VIBRATILE TYPE

[75] Inventor: Frank Massa, Cohasset, Mass.

[73] Assignees: Fred M. Dellorfano, Jr.; Donald P. Massa, both of Cohasset, Mass. ; Trustees of The Stoneleigh Trust

[21] Appl. No.: 946,647

[22] Filed: Sep. 28, 1978

[51] Int. Cl.[2] .............................................. H01L 41/10

[52] U.S. Cl. .................................... 310/322; 310/334; 310/330; 310/335

[58] Field of Search ............... 310/321, 322, 324, 335, 310/330-332, 334; 179/110 A

[56] References Cited

U.S. PATENT DOCUMENTS

| | | | |
|---|---|---|---|
| 1,766,036 | 6/1930 | Crossley | 310/348 |
| 3,849,679 | 11/1974 | Massa | 310/322 X |
| 3,879,726 | 4/1975 | Sweany | 179/110 A |
| 3,928,777 | 12/1975 | Massa | 310/322 X |
| 4,056,741 | 11/1977 | Hoerz et al. | 310/322 |

*Primary Examiner*—Mark O. Budd

[57] ABSTRACT

A transducer of the flexural resonant vibratile rectangular type is described in which a housing includes a square frame-like mounting structure with a square opening for receiving the vibratile plate assembly. V-shaped projecting ribs from the center of the inner sides of the square opening provide locating points for precisely positioning the periphery of the square vibratile plate assembly concentrically with the square opening. A second set of four V-shaped ribs are located at right angles to the ribs projecting from the inner sides of the square opening and lie in a plane to provide support for the face of the vibratile plate assembly. All of the V-shaped ribs are located near the nodal regions of the vibratile plate and present minimal area of contact with the vibratile plate.

10 Claims, 8 Drawing Figures

ELECTROACOUSTIC TRANSDUCERS OF THE FLEXURAL RESONANT VIBRATILE TYPE

This invention is concerned with improvements in electroacoustic transducers of the flexural resonant vibratile type such as, for example, are illustrated in U.S. Pat. Nos. 3,752,941 and 3,937,991, which describe a flexural vibratile bi-laminar square plate suspended at its nodal points within a frame-like support structure. In U.S. Pat. No. 3,752,941, the square bi-laminar plate is flexibly supported by two thin ribbon conductors mounted at right angles to each other on opposite sides of the vibratile plate. In U.S. Pat. No. 3,937,991, the bi-laminar plate is supported within a frame-like structure by resilient pads which flexibly attach the bi-laminar plate at its nodal points to the surface of the support frame structure.

The nodal support systems disclosed in the above-mentioned recent prior art patents satisfactorily overcome the disadvantages inherent in earlier prior art nodal support systems, as illustrated in U.S. Pat. Nos. 3,268,855 and 3,518,460. In U.S. Pat. No. 3,518,460, the described nodal mounting system comprises four stiff wires 61, 62, 63, 64, soldered to the center points of each of the four sides of a square vibratile plate, as shown in FIGS. 5, 6, and 7 of the patent. The disadvantages inherent in this earlier prior art construction results from the mass of the stiff wire mounts plus the added mass of solder used to attach the stiff wires to the nodal regions of the vibratile plate which causes significant variations in the response characteristics among production lots of assembled transducer elements. In U.S. Pat. No. 3,268,855, the described nodal mounting system utilizes spring clips clamped to the nodal regions of the square vibratile plate, as illustrated in FIG. 4 and 5 of the patent. The disadvantage inherent in this earlier prior art type of construction results from the lateral displacement of the vibratile plate which is possible within the spring-held mounting structure that is used in the construction. The nodal mounting systems disclosed in the more recent prior art U.S. Pat. Nos. 3,752,941 and 3,937,991 overcome the disadvantages of the earlier prior art designs and both of the more recently disclosed designs have met with considerable commercial success.

One of the remaining disadvantages inherent in the more recent designs above described is that the alignment of the vibratile plate assembly within the frame-like mounting structure requires the use of special locating fixtures which results in increased production cost necessitated by the skilled labor required to assemble the bi-laminar plates in precise spaced relationship to the support structure during the manufacture of the transducer.

The present invention overcomes the remaining disadvantages of the more recent prior art structures by eliminating the need to employ locating fixtures and skilled labor for the precise positioning of the vibratile plate within the frame-like mounting structure to insure uniformity in the performance characteristics of the assembled transducers. The present invention provides a plurality of support points within the housing structure for precisely locating the position of the vibratile plate within the housing. The support points include small triangular knife-edge projections from the four sides of the frame-like structure within which the vibratile plate is mounted. These four triangular projections precisely locate the edges of the square vibratile plate with respect to the four sides of the frame-like support member. Four additional knife-edge projections are provided for supporting the flat surfacee of the vibratile plate at its nodal points in a plane at right angles to the previously mentioned triangular knife-edge spacers. The inventive transducer construction eliminates all need for the use of locating fixtures during the assembly of the vibratile plate to the supporting frame, as will be evident from the disclosure which follows.

The primary object of this invention is to improve the design of an electroacoustic transducer employing a vibratile square plate operating at its fundamental free resonant mode of vibration.

Another object of this invention is to provide a plurality of small knife-edge projections from the surfaces of a frame-like mounting structure which are arranged to provide positive accurate locating points for the precise positioning of the vibratile plate along three mutual perpendicular axes when the vibratile plate is placed inside the frame-like mounting structure.

Still another object of this invention is to improve the uniformity of the response characteristics of mass-produced quantities of transducers employing a bi-laminar vibratile square plate which operates at its fundamental flexural free resonant frequency mode.

A still further object of this invention is to reduce the assembly time required in the construction of large quantities of transducers employing a flexural vibratile plate by including in the housing structure a plurality of locating points which precisely position the nodal points of the vibratile plate without restraining the free flexural resonant mode of vibration of the vibratile plate.

A further object of this invention is to design a one-piece housing structure that includes a nodal mounting system for the precise positioning of a bi-laminar vibratile plate when it is placed inside the housing. The housing also includes a surface which is parallel to the plane of the assembled vibratile plate. The housing surface is also designed to provide a solid masking area directly opposite the central 50% portion of the total area of the vibratile plate to suppress the radiation from the central area of the vibratile plate, and additionally, the housing surface is perforated directly opposite the four corners of the vibratile plate to permit the transmission of the in-phase sound vibrations from the four corner areas of the vibratile plate when it is vibrating at its fundamental free flexural resonant frequency mode.

The novel features which are characteristic of this invention are set forth with particularity in the appended claims. The invention itself, however, both as to its organization and method of operation, as well as additional advantages thereof will best be understood by reference to the following description taken in conjunction with the accompanying drawings in which:

Figure 1:
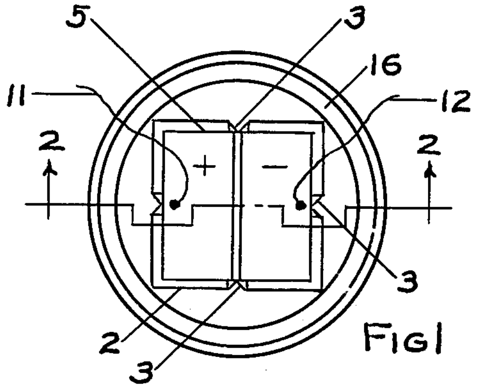
FIG. 1 is a rear plan view of the inventive transducer looking down into the housing with the rear lid of the housing removed.
Figure 4:
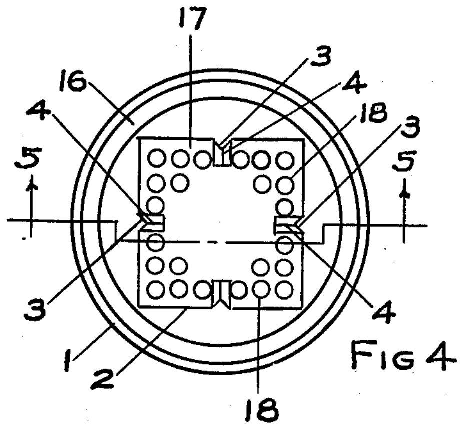
FIG. 4 is a rear plan view of the housing alone showing the details of the knife-edge support members incorporated into the housing structure for precisely locating the position of the vibratile plate transducer element within the housing structure.

Referring to the figures, the reference character 1 represents the housing structure employed in the inventive design which is preferably made from molded plastic. The housing structure includes a square recessed portion 2 within the inner flat surface of the housing, as illustrated in FIGS. 1, 2, 4, and 5, within which the vibratile plate member is assembled. Projecting from the center of each of the four sides of the square recessed opening 2 is a V-shaped spacer 3 which provides knife-edge stops for precisely maintaining the concentric alignment of the vibratile bi-laminar plate assembly within the boundary of the recessed portion of the housing structure. At right angles to the four vertical V-shaped spacers 3 are four additional V-shaped spacers 4 whose knife-edge support members lie in a plane and determine the precise spacing of the bi-laminar vibratile plate assembly from the bottom wall surface of the recessed portion 2 when the vibratile plate is assembled inside the housing structure.

The vibratile plate assembly comprises a polarized ceramic plate 5 bonded in the conventional manner, as is well known in the art, to a square plate 6 using a rigid cement such as epoxy. The square plate 6 may be a polarized ceramic plate which, in combination with the ceramic plate 5, produces a well known bi-morph assembly which generates flexural vibrations when A-C voltages are applied to the surfaces of the ceramic plate, as is well known to any one skilled in the art. Alternately, the plate 6 may be an inert material preferably having a high ratio of modulus of elasticity to density, and preferably chosen so that a minimum mass of plate material is required for obtaining a specified resonant frequency for the assembly. Aluminum has been generally used to satisfy this requirement. In certain instances, however, the relatively high temperature coefficient of expansion of aluminum in comparison with the temperature coefficient of expansion of piezoelectric ceramics causes thermal stresses to be developed in the ceramic element which may lead to variations in the performance characteristics of the transducer. This is particularly true with some of the lead-zirconate-titanate ceramic compositions such as those which include additives to increase the dielectric constant of the ceramic and which also reduces the Curie point of the material. To avoid variations induced by thermal stresses in situations where such variations may exceed the specification requirements of the transducer, it is possible to advantageously use an inert ceramic or glass plate of a composition which has a high modulus to density ratio as a suitable material for plate 6. Alumina, which is fired aluminum oxide, and has a high modulus of elasticity which is approximately four times the modulus of aluminum, and which also has a low temperature coefficient of expansion which is compatible with the low-temperature coefficient of expansion of piezoelectric ceramics, is particularly suitable as a substitute for aluminum as the material for plate 6.

Figure 6:
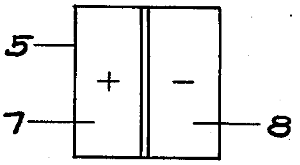
FIG. 6 is a top plan view of a preferred type of polarized ceramic plate used in the transducer vibratile element assembly.
Figure 7:
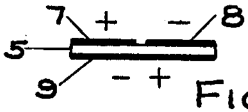
FIG. 7 is an edge view of the ceramic plate shown in FIG. 6.
Figure 8:
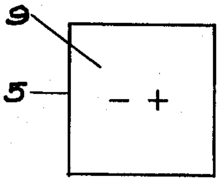
FIG. 8 is a bottom plan view of the ceramic plate illustrated in FIG. 6.

When the bi-laminar vibratile element comprises a bonded assembly of a piezoelectric ceramic plate 5 with an inert plate 6, the electrode configuration and polarization of the ceramic element is preferably arranged, as shown in FIGS. 6, 7, and 8. The metallic electrodes which are applied to the ceramic surfaces in the conventional manner well known in the art, are split into two separated areas 7 and 8 on one side of the ceramic plate 5, as shown in FIG. 6, and a single electrode surface 9 is applied to the opposite side of the ceramic plate, as shown in FIG. 8. When the ceramic plate is polarized, the positive potential (+) of the polarizing voltage is connected to electrode surface 7, and the negative potential (−) of the polarizing voltage is connected to the electrode surface 8. The center tap from the polarizing potential (−+) is connected to the electrode surface 9. When an A-C potential is applied to the electrodes 7 and 8, after the polarized ceramic plate 5 is bonded to the plate 6, flexural vibrations of the bi-laminar plate assembly will take place.

Figure 5:
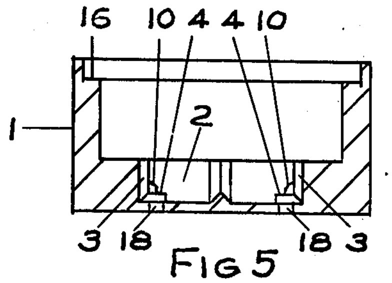
FIG. 5 is a section taken along the line 5—5 of FIG. 4.
Figure 3:
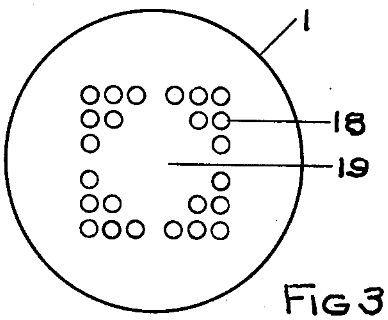
FIG. 3 is a front plan view of the transducer.

To assemble the vibratile bi-laminar plate inside the housing, a small amount of flexible rubber cement 10, such as Silastic, which is a silicone rubber product manufactured by Dow Corning, is applied at the junction points of the V-shaped spacer members 3 and 4, as illustrated in FIG. 5, after which the bi-laminar plate assembly is placed into the recessed opening 2 and lowered therein until the nodal points of the vibratile bi-laminar plate rest on the knife-edge support members 4. The silicone rubber spots 10 will become squeezed during the lowering of the bi-laminar plate and will fill the spaces between the edges of the nodal region of the vibratile plate and the surrounding frame-like supporting structure, thus flexibly holding the plate in its precise position, as determined by the precise locations of the knife-edge support members 3 and 4. The support members 3 and 4 are located at the nodal points of the vibratile plate assembly when it is vibrating at its fundamental free resonant frequency mode of vibration. The touching of the knife-edge support members against the nodal points of the vibrating bi-laminar plate assembly will not influence the mode of vibration of the bi-laminar plate. The presence of the flexible spots of silicone rubber at the nodal regions of the vibratile plate assembly will also have no influence on the mode of vibration of the bi-laminar plate.

Figure 2:
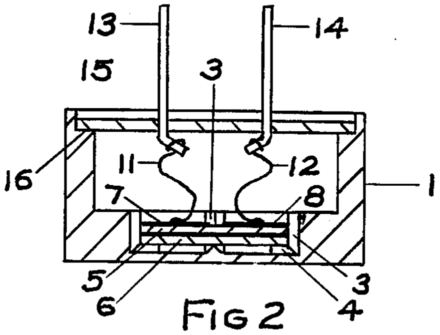
FIG. 2 is a cross-sectional view taken along the line 2—2 in FIG. 1 with the rear lid in place.

To complete the transducer assembly, a flexible electrical conductor 11 is soldered to the electrode surface 7 and also to the terminal pin 13, and a flexible electrical conductor 12 is soldered to the electrode surface 8 and to terminal pin 14, as shown in FIG. 2. The terminal pins 13 and 14 are forced-fit into tight holes provided in the terminal plate 15 which is cemented or ultrasonically welded to the recessed rim surface 16 of the housing to complete the transducer assembly.

During the operation of the bi-laminar plate at its fundamental resonance frequency, the four corners of the square vibratile plate will move in phase with each other and will move in opposite phase to the center area of the vibratile plate. In order to transmit the in-phase corner vibrations of the vibratile plate to the medium external to the housing and to suppress the radiation from the out-of-phase vibration from the central area of the vibratile plate, the flat surface 17 of the recessed portion 2 of the housing is perforated with four groups of holes 18 located over the in-phase vibrating corner portions of the vibratile plate. The solid central unperforated square portion 19 of the flat surface 17 is located over the central out-of-phase vibrating portion of the vibratile plate and serves as a mask for suppressing the out-of-phase vibrations from radiating into the medium.

The figures and the accompanying description have described a novel low-cost transducer design which achieves the very precise positioning of a vibratile plate assembly within the transducer housing by providing within the housing structure a recessed portion for receiving the vibratile plate. The recessed portion of the housing structure is provided with V-shaped knife-edge locating members which precisely position the vibratile plate assembly within the housing, as is required to achieve optimum transducer performance and uniformity of operational performance characteristics among large quantities of mass-produced transducer assemblies. The combination of the unique unitary housing design, as disclosed, which includes a plurality of self-contained support members for precisely locating the vibratile bi-laminar plate assembly at its nodal points, eliminates the necessity for using locating fixtures and highly skilled assembly technicians, as is required in the assembly of prior art transducers and thus achieves the objects of this invention.

While a few specific embodiments of the present invention have been shown and described, it should be noted that various additional modifications and alternative constructions may be made without departing from the true spirit and scope of the invention. Therefore, the appended claims are intended to cover all such equivalent alternative constructions that fall within their true spirit and scope.

I claim:

1. In combination in an electroacoustic transducer, a flexural vibratile rectangular plate assembly comprising a plurality of bonded plates in which at least one plate has the property of changing its lateral dimensions upon the application of an electrical signal to said plate, a mounting structure, said mounting structure including an opening bounded by a peripheral wall surface, said opening having a shape and size to provide mechanical clearance between said peripheral wall surface and the periphery of said vibratile plate assembly, said mounting structure characterized in that it includes a first plurality of support members projecting from said peripheral wall surface adapted to serve as spacers between the peripheral wall surface of said opening in said mounting structure and the periphery of said vibratile plate assembly, and a second plurality of support members located in a plane at right angles to the peripheral wall surface of said opening, whereby said first and said second plurality of support members serve to precisely locate the position of said vibratile plate, said support members characterized in that the area of contact between said support members and said vibratile plate assembly, when said vibratile plate assembly is placed within said mounting structure, is negligibly small compared with the total area of said vibratile plate, and still further characterized in that said support members are located within said mounting structure in such position that upon placing said vibratile plate assembly within said opening said support members make contact only with the nodal regions of said vibratile plate assembly when said vibratile plate assembly vibrates at its fundamental flexural resonant mode, a resilient rubber-like adhesive between the nodal regions of said vibratile plate assembly and the surfaces of said support members whereby the position of said vibratile plate assembly is resiliently fixed relative to the opening in said mounting structure, and electrical conductors connected to said vibratile plate assembly.

2. The invention in claim 1 characterized in that the shape of said bi-laminar plate assembly is approximately square, said mounting structure is rigid, said opening in said mounting structure is approximately square, said first plurality of support members comprise a first group of four narrow V-shaped projecting ribs, each rib is located at the center of one of the four sides of said square opening whereby to provide line contact spacers between the inner peripheral wall of said square opening in said mounting structure and the center points of the peripheral edges of the said square bi-laminar plate, said first group of narrow ribs characterized in that their projecting V-shaped contact edges are approximately perpendicular to the plane of the opening in said mounting structure, said second plurality of support members comprise a second group of four narrow V-shaped projecting ribs characterized in that the projecting V-shaped contact edges of said second group of ribs lie in a plane which is parallel to the plane of the opening in said mounting structure, and further characterized in that each opposite pair of said projecting V-shaped contact edges of said second group of ribs lie along the two perpendicular bisecting axes of the square opening in said mounting structure, and further characterized in that said projecting V-shaped edges of said ribs are of minimum length sufficient only to bridge the clearance gap between the peripheries of the vibratile plate assembly and the square opening in said mounting structure and to provide a minimal length of line support at the nodal regions of the peripheral surface area of the square vibratile plate.

3. The invention in claim 2 and a cup-shaped housing structure having a bottom end portion and a tubular peripheral wall portion, said bottom end portion of said housing structure having an inner plane wall surface and outer wall surface, said inner plane wall surface characterized in that it is parallel to the plane of the square opening in said mounting structure, and further characterized in that the central axis normal to said inner plane wall surface of said housing structure is in alignment with the central axis normal to the plane of the square opening in said mounting structure.

4. The invention in claim 3 characterized in that said mounting structure is an integral part of said housing structure.

5. The invention in claim 4 characterized in that said bottom end portion of said housing structure is perforated in four regions which correspond to the location of the four corner regions of the vibratile plate which are moving together in the same phase when the vibratile plate is operating at its free flexural fundamental resonant mode.

6. The invention in claim 5 further characterized in that the unperforated area of the bottom end portion of said housing structure which lies between the four corner perforated areas is directly opposite the center portion of the vibratile plate which is assembled within said housing structure.

7. The invention in claim 6 further characterized in that said center unperforated area in said bottom end portion of said housing structure is approximately square and said square unperforated area is oriented so that each corner of said unperforated square area lies approximately in alignment with the four center points of the four sides of said square bi-laminar vibratile plate assembly.

8. The invention in claim 7 characterized in that one of the plates which comprise the vibratile plate assembly is aluminum.

9. The invention in claim 7 characterized in that one of the plates which comprise the vibratile plate assembly is non-metallic.

10. The invention in claim 9 characterized in that said non-metallic plate is a ceramic and further characterized in that said ceramic is fired aluminum oxide known as alumina.

* * * * *